United States Patent
Kempf (10) Patent No.: US 7,339,254 B1
(45) Date of Patent: Mar. 4, 2008

(54) SOI SUBSTRATE FOR INTEGRATION OF OPTO-ELECTRONICS WITH SIGE BICMOS

(75) Inventor: Paul H. Kempf, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 11/018,164

(22) Filed: Dec. 20, 2004

Related U.S. Application Data (63) Continuation-in-part of application No. 10/970,645, filed on Oct. 20, 2004.

(51) Int. Cl.
    *H01L 27/082* (2006.01)
    *H01L 27/102* (2006.01)
    *H01L 29/70* (2006.01)
    *H01L 31/11* (2006.01)

(52) U.S. Cl. ............... 257/577; 257/517; 257/526; 257/350; 438/360; 438/345; 438/328

(58) Field of Classification Search ............... 257/350, 257/517, 565, 183, 197, 526, 577; 438/360, 438/309, 311, 318, 312, 314, 328, 345
See application file for complete search history.

(56) References Cited

U.S. PATENT DOCUMENTS

| | | | | |
|---|---|---|---|---|
| 5,627,395 A | * | 5/1997 | Witek et al. | 257/350 |
| 6,232,649 B1 | * | 5/2001 | Lee | 257/588 |
| 6,548,364 B2 | * | 4/2003 | Hsu | 438/311 |
| 6,815,305 B2 | * | 11/2004 | Cha | 438/360 |
| 7,218,826 B1 | * | 5/2007 | Gunn et al. | 385/131 |
| 2002/0053737 A1 | * | 5/2002 | Kondo et al. | 257/758 |
| 2003/0162350 A1 | * | 8/2003 | Muller et al. | 438/235 |
| 2004/0209418 A1 | * | 10/2004 | Knoll et al. | 438/202 |
| 2004/0222436 A1 | * | 11/2004 | Joseph et al. | 257/197 |
| 2004/0262619 A1 | * | 12/2004 | Takahashi et al. | 257/79 |
| 2005/0053347 A1 | * | 3/2005 | West et al. | 385/129 |

* cited by examiner

*Primary Examiner*—George R. Fourson
*Assistant Examiner*—John M. Parker
(74) *Attorney, Agent, or Firm*—Farjami & Farjami LLP

(57) ABSTRACT

According to an exemplary embodiment, a structure includes a silicon-on-insulator substrate including a buried oxide layer situated over a bulk silicon substrate and a silicon layer situated over the buried oxide layer. The structure further includes a trench formed in the silicon layer and the buried oxide layer, where the trench has a bottom surface and a first and a second sidewall, and where the trench is situated adjacent to an optical region of the silicon-on-insulator substrate. According to this exemplary embodiment, the structure further includes an epitaxial layer situated in the trench and situated on the bulk silicon substrate, where the epitaxial layer and the bulk silicon substrate form a bulk silicon electronic region of the silicon-on-insulator substrate. The structure further includes a base of a bipolar transistor situated on the epitaxial layer, where the base can be silicon-germanium.

20 Claims, 8 Drawing Sheets

SOI SUBSTRATE FOR INTEGRATION OF OPTO-ELECTRONICS WITH SIGE BICMOS

The present application claims priority to, and is a continuation-in-part ("CIP") of, a co-pending application entitled "Method for Opto-Electronic Integration on a SOI Substrate and Related Structure," Ser. No. 10/970,645, filed on Oct. 20, 2004 and assigned to the assignee of the present invention. The disclosure in that co-pending application is hereby incorporated fully by reference into the present application.

BACKGROUND OF THE INVENTION

1. Field of the Invention

The present invention is generally in the field of semiconductors. More specifically, the invention is in the field of semiconductor substrates for fabrication of optical components and bulk silicon electronics.

2. Background Art

Different substrate requirements for optical components, such as waveguides, gratings, and modulators, and bulk silicon electronic devices, such as bulk silicon electronic devices formed using Bipolar Complementary-Metal-Oxide-Semiconductor ("BiCMOS") technology, hinder the integration of optical components and bulk silicon electronics on a single substrate. For example, optical components can be optimized on a Silicon-On-Insulator ("SOI") substrate having a thin silicon layer situated over a thicker buried oxide layer, which is in turn situated over bulk silicon. In a SOI substrate that is optimized for optical components, the thin silicon layer in the SOI substrate can have a thickness of, for example, a few thousand Angstroms. However, bulk silicon electronic devices, such as silicon-germanium ("SiGe") bipolar transistors and other devices formed using SiGe BiCMOS technology, require much thicker silicon, such as silicon having a thickness of hundreds of microns.

Optical components have been fabricated using Silicon-On-Saphire ("SOS") technology, which takes advantage of a transparent saphire substrate. However, an undesirably high defectivity rate in SOS substrates reduces the feasibility of integrating optical components and bulk silicon electronics on a SOS substrate. Additionally, the cost of the SOS substrate is very high.

Thus, there is a need in the art for a semiconductor substrate for effectively integrating optical components and bulk silicon electronic devices, such as devices formed using SiGe BiCMOS technology.

SUMMARY OF THE INVENTION

The present invention is directed to a SOI substrate for integration of opto-electronics with SiGe BiCMOS. The present invention addresses and resolves the need in the art for a semiconductor substrate for effectively integrating optical components and bulk silicon electronic devices, such as devices formed using SiGe BiCMOS technology.

According to an exemplary embodiment, a structure includes a silicon-on-insulator substrate including a buried oxide layer situated over a bulk silicon substrate and a silicon layer situated over the buried oxide layer. The structure further includes a trench formed in the silicon layer and the buried oxide layer, where the trench has a bottom surface and a first and a second sidewall, and where the trench is situated adjacent to an optical region of the silicon-on-insulator substrate.

According to this exemplary embodiment, the structure further includes an epitaxial layer situated in the trench and situated on the bulk silicon substrate, where the epitaxial layer and the bulk silicon substrate form a bulk silicon electronic region of the silicon-on-insulator substrate. The structure further includes a base of a bipolar transistor situated on the epitaxial layer, where the base can be silicon-germanium. The base can be situated over a collector of the bipolar transistor, where the collector is situated in the epitaxial layer. The structure can further include an emitter of the bipolar transistor situated on the base. The structure can further include an interlayer dielectric layer situated over the silicon-on-insulator substrate. A first interconnect metal segment and a second interconnect metal segment can be situated on the interlayer dielectric layer, where the first interconnect metal segment can be connected to the optical region by a first contact and the second interconnect metal segment can be connected to the base of the bipolar transistor by a second contact.

According to one embodiment, the invention is a method for fabricating the above-described structure. Other features and advantages of the present invention will become more readily apparent to those of ordinary skill in the art after reviewing the following detailed description and accompanying drawings.

DETAILED DESCRIPTION OF THE INVENTION

The present invention is directed to a SOI substrate for integration of opto-electronics with SiGe BiCMOS. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

The present invention involves a process to effectively integrate optical components and bulk silicon electronic devices, such as devices formed by using SiGe BiCMOS technology, on a SOI (silicon-on-insulator) substrate. As will be discussed in detail below, the present invention provides a SOI substrate having optical regions for formation of optimized optical components, such as optimized waveguides, gratings, and modulators, and bulk silicon electronic regions for formation of bulk silicon electronic devices, such as SiGe bipolar transistors and other devices formed using SiGe BiCMOS technology.

Figure 1:
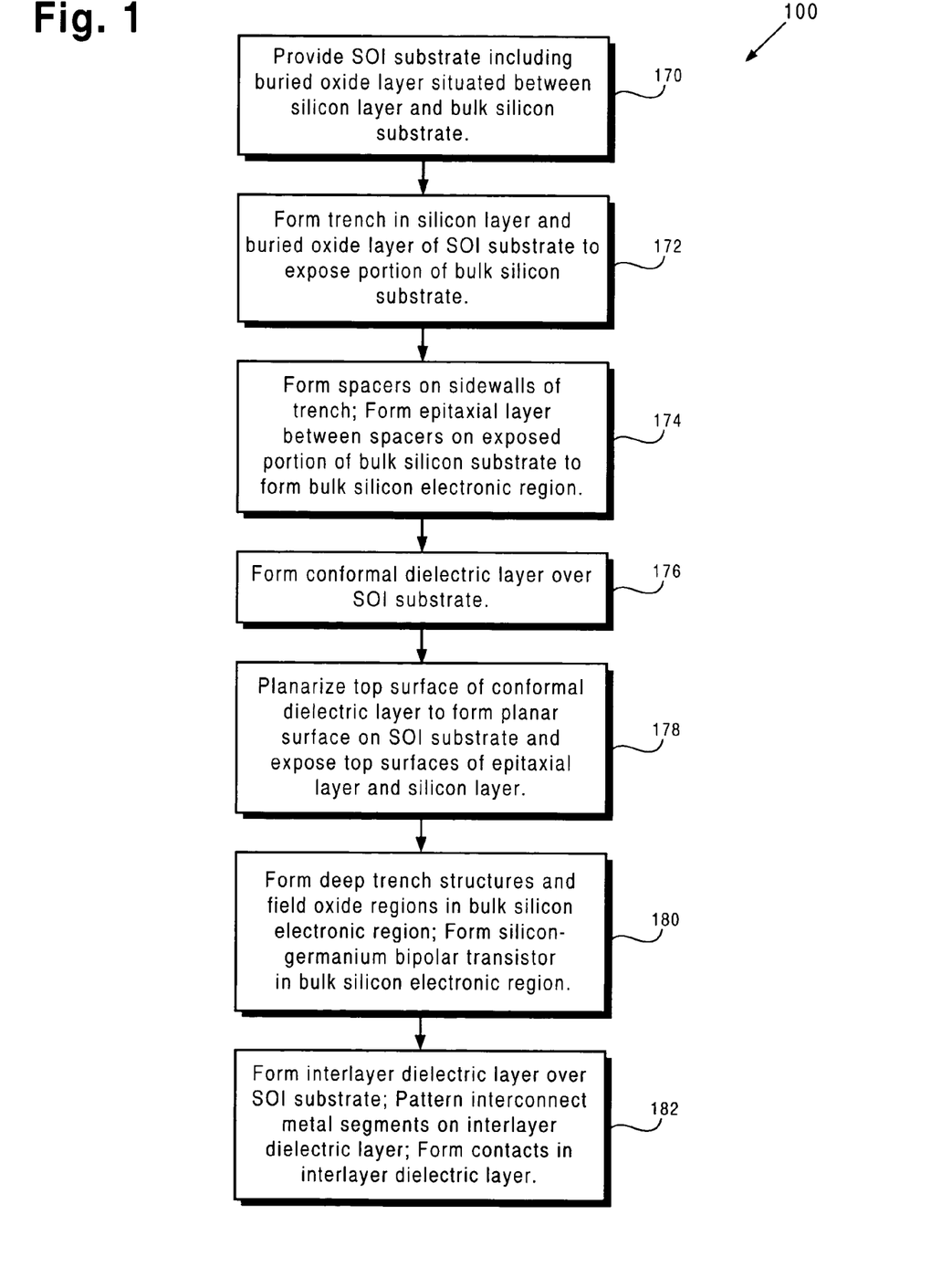
FIG. 1 shows a flowchart illustrating exemplary steps taken to implement an embodiment of the present invention.

FIG. 1 shows a flow chart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe one embodiment of the present invention, other embodiments of the invention may utilize steps different from those shown in flowchart 100.

Moreover, structures 270 through 282 in FIGS. 2A through 2G illustrate the result of performing steps 170 through 182 of flowchart 100, respectively. For example, structure 270 shows a semiconductor structure after processing step 170, structure 272 shows structure 270 after the processing of step 172, structure 274 shows structure 272 after the processing of step 174, and so forth. It is noted that although formation of only one bulk silicon electronic region and two optical regions are specifically discussed herein to preserve brevity, multiple bulk silicon electronic regions and optical regions may be formed on a SOI substrate by utilizing the innovative process of the present invention.

Figure 2A:
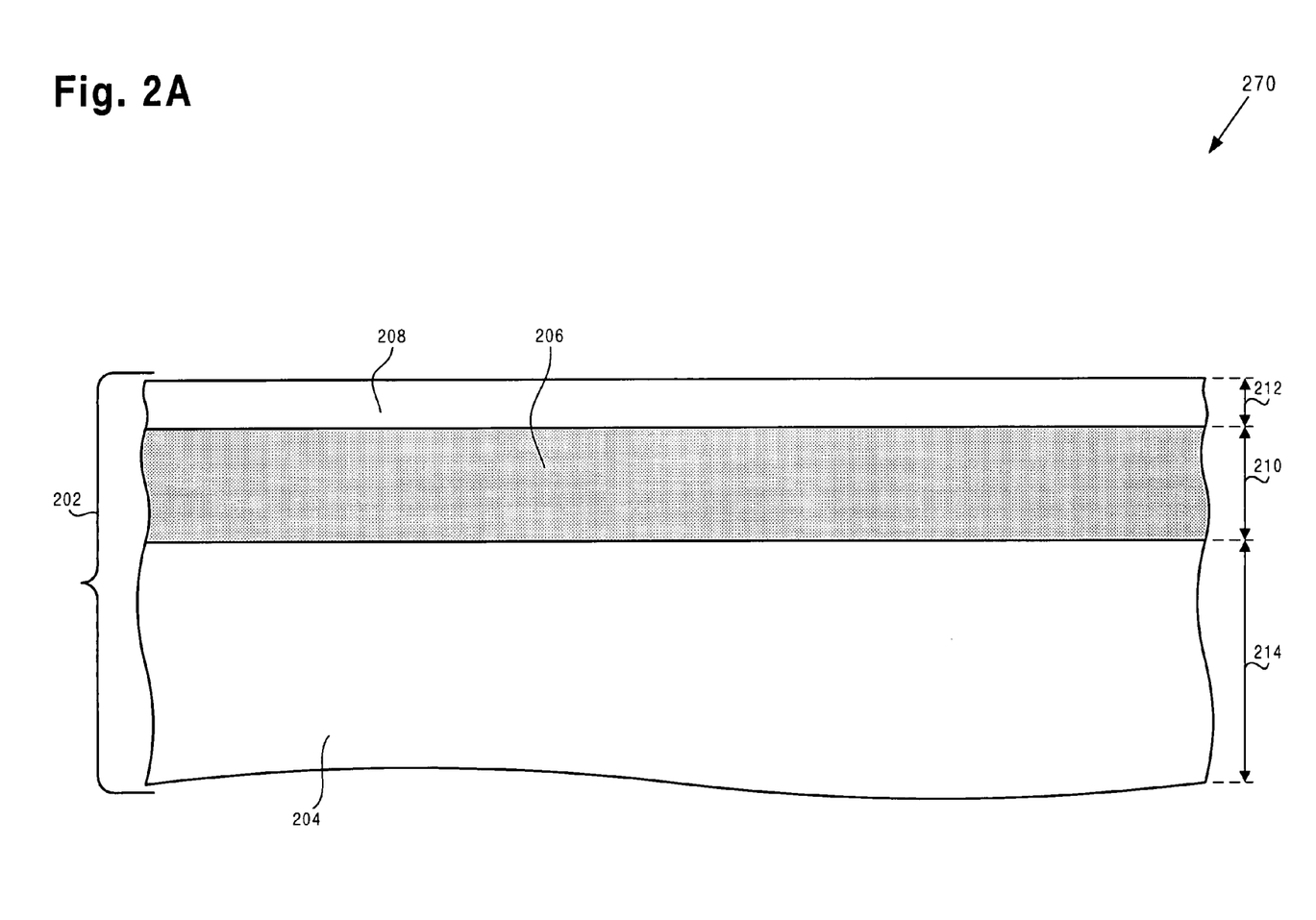
FIG. 2A illustrates a cross-sectional view, which includes a portion of a wafer processed according to an embodiment of the invention, corresponding to an intermediate step of the flowchart in FIG. 1.

Referring now to step 170 in FIG. 1 and structure 270 in FIG. 2A, at step 170 of flowchart 100, SOI substrate 202 is provided, which includes bulk silicon substrate 204, buried oxide layer 206, which is situated on bulk silicon substrate 204, and silicon layer 208, which is situated on buried oxide layer 206. SOI substrate 202 can be optimized for formation of optical components, such as waveguides, gratings, and modulators, by appropriately controlling thickness 210 of buried oxide layer 206 and thickness 212 of silicon layer 208. By way of example, for optimal optical component formation, thickness 210 of buried oxide layer 206 can be approximately 1.25 microns while thickness 212 of silicon layer 208 can be between approximately 3000.0 Angstroms and approximately 6000.0 Angstroms. By way of example, thickness 214 of bulk silicon substrate 204 can be approximately 1.0 mm.

SOI substrate 202 can be formed, for example, by thermally growing a layer of silicon oxide on a silicon surface on each of two wafers. The oxidized surfaces of the wafers can then be pressed against each other at a sufficiently high temperature to cause the wafers to bond together. Silicon oxide situated in the bonding plane of the bonded wafers forms a buried oxide layer, i.e. buried oxide layer 206, in the subsequently formed SOI substrate, i.e. SOI substrate 202. The excess silicon in one of the wafers can be removed by an etching process, a grinding process, or other appropriate process such that a silicon layer, i.e. silicon layer 208, having a desired thickness is obtained. SOI substrate 202 can also be formed by other appropriate methods as known in the art. The result of step 170 of flowchart 100 is illustrated by structure 270 in FIG. 2A.

Figure 2B:
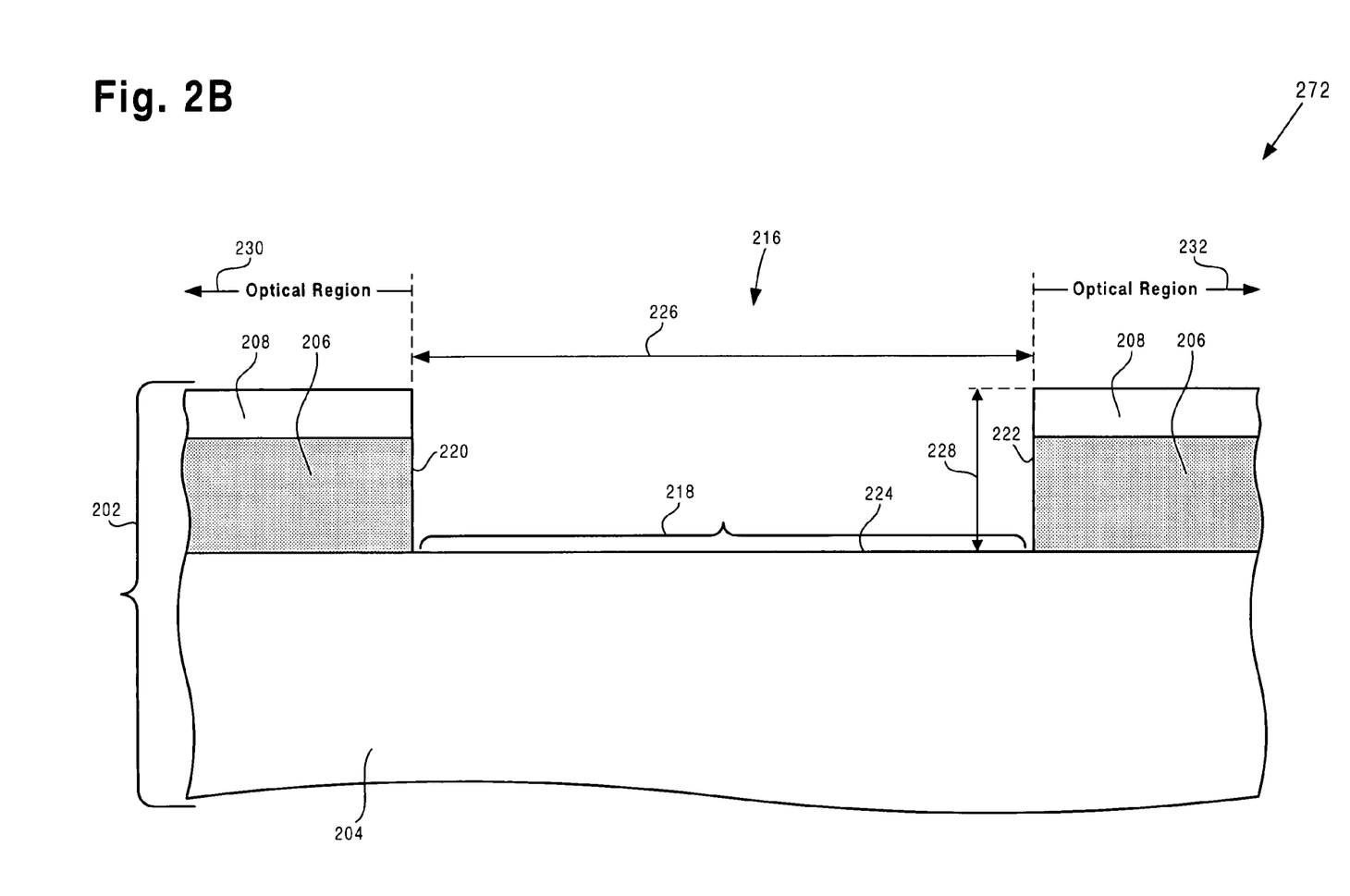
FIG. 2B illustrates a cross-sectional view, which includes a portion of a wafer processed according to an embodiment of the invention, corresponding to an intermediate step of the flowchart in FIG. 1.

Referring to step 172 in FIG. 1 and structure 272 in FIG. 2B, at step 172 of flowchart 100, trench 216 is formed in silicon layer 208 and buried oxide layer 206 of SOI substrate 202 to expose portion 218 of bulk silicon substrate 204. Trench 216 has sidewalls 220 and 222, bottom surface 224, width 226, and depth 228. By way of example, width 226 of trench 216 can be between approximately 6.0 microns and approximately 10.0 microns. In other embodiments, width 226 of trench 216 can be much greater than 10.0 microns. By way of example, depth 228 of trench 216 can be between approximately 1.5 microns and approximately 2.0 microns. Sidewalls 220 and 222 of trench 216 define edges of respective optical regions 230 and 232 of SOI substrate 202.

Trench 216 can be formed by using a masking process to deposit and pattern a photoresist mask on silicon layer 208. The photoresist mask covers optical regions 230 and 232 of SOI substrate 202 while leaving a trench opening uncovered. In one embodiment, a masking process can be used to form a silicon oxide hard mask by using a photoresist mask to pattern a layer of silicon oxide, which is deposited on silicon layer 208. After the trench opening has been formed in the photoresist mask, portions of silicon layer 208 and buried oxide layer 206 are sequentially removed in the trench opening by using an appropriate etch process and/or processes to form trench 216. For example, a dry etch process can initially be used to ensure straight trench sidewalls and achieve a desired trench depth. After the dry etch process, a wet etch process can be used to remove any remaining oxide in the trench and ensure a high quality trench bottom surface. The wet etch process can comprise an etchant such as hydrofluoric acid (HF), which is selective to silicon and, therefore, will cause minimal erosion of bulk silicon substrate 204. The HF wet etch process or, alternatively, an appropriate solvent can be used to strip the photoresist mask after formation of trench 216. The result of step 172 of flowchart 100 is illustrated by structure 272 in FIG. 2B.

Figure 2C:
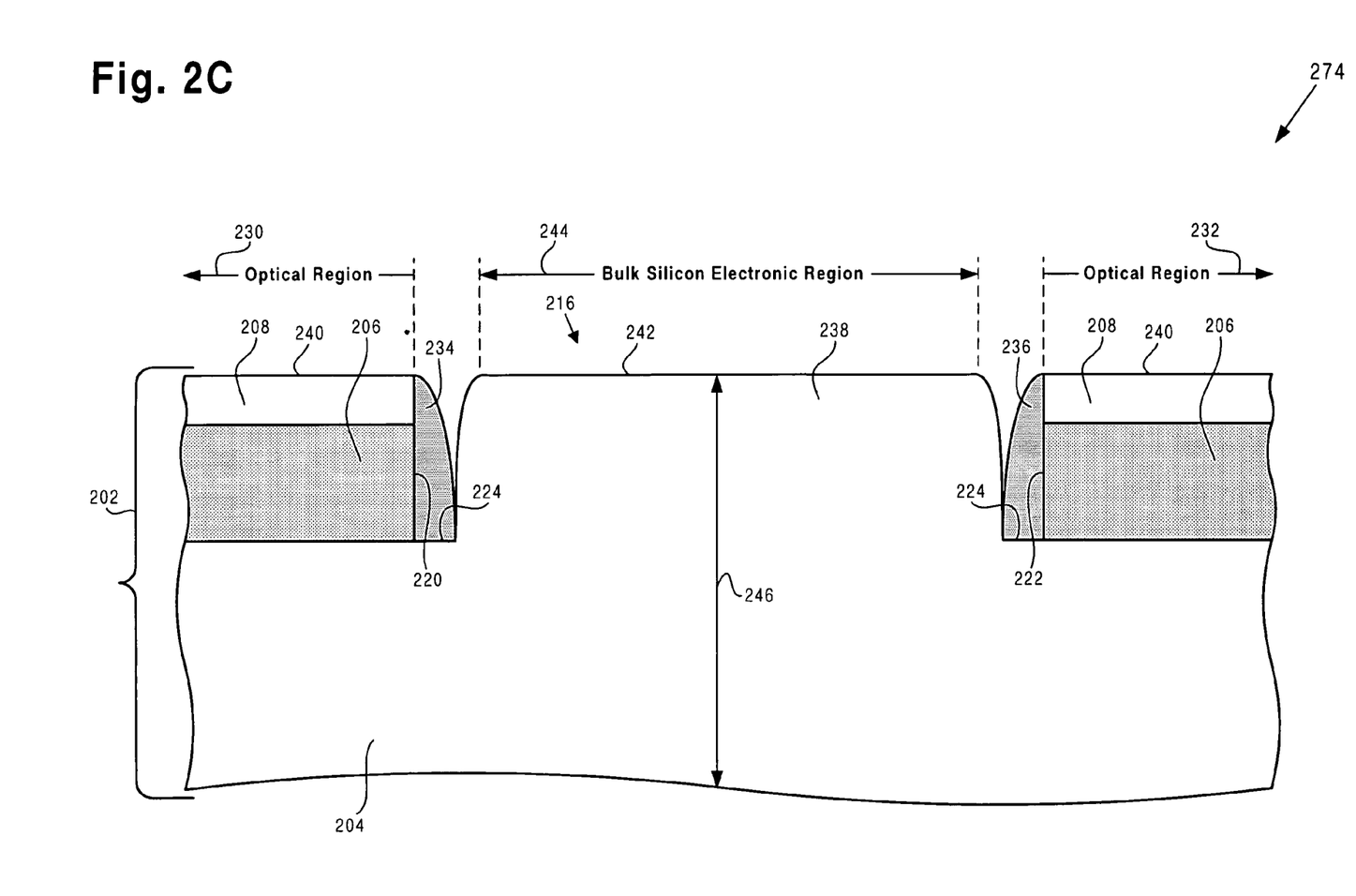
FIG. 2C illustrates a cross-sectional view, which includes a portion of a wafer processed according to an embodiment of the invention, corresponding to an intermediate step of the flowchart in FIG. 1.

Referring to step 174 in FIG. 1 and structure 274 in FIG. 2C, at step 174 of flowchart 100, spacers 234 and 236 are formed on respective sidewalls 220 and 222 of trench 216 and epitaxial layer 238 is formed between spacers 234 and 236 on exposed portion 218 (FIG. 2B) of bulk silicon substrate 204 to form bulk silicon electronic region 244 of SOI substrate 202. Spacers 234 and 236 are situated on bottom surface 224 and on respective sidewalls 220 and 222 of trench 216 and can comprise silicon oxide or other appropriate dielectric material. Spacers 234 and 236 can be formed, for example, by depositing a conformal layer of silicon oxide over silicon layer 208 and over sidewalls 220 and 222 and bottom surface 224 of trench 216. The deposited conformal layer of silicon oxide can then be "etched back" using an anisotropic etch process, which can comprise an etchant that is selective to silicon and, consequently, will not etch bulk silicon substrate 204. Spacers 234 and 236 prevent silicon from growing on exposed edges of silicon layer 208 during subsequent epitaxial layer formation.

Epitaxial layer 238 is situated between spacers 234 and 236 in trench 216 and on bulk silicon substrate 204 and can comprise single-crystal silicon. Epitaxial layer 238 can be formed on exposed portion 218 (FIG. 2B) of bulk silicon substrate 204 by using a selective epitaxial process. In the selective epitaxial process, single-crystal silicon is grown on exposed portion 218 (FIG. 2B) of bulk silicon substrate 204 and not grown on unexposed portions of bulk silicon substrate 204, such as optical regions 230 and 232 and spacers 234 and 236. To prevent silicon from growing on top surface 240 of silicon layer 208 in optical regions 230 and 232, optical regions 230 and 232 can be covered by a mask (not shown in FIG. 2C), such as a photoresist mask or a hard mask. The selective epitaxial process can be implemented by using a chemical vapor deposition ("CVD") process or other appropriate processes to deposit silicon only on exposed silicon surfaces, such as exposed portion 218 (FIG. 2B) of bulk silicon substrate 204. Thus, the selective epitaxial process is selective to, i.e. will not deposit silicon on, dielectric surfaces comprising oxide, such as spacers 234 and 236, or surfaces protected by a mask (not shown in FIG. 2C), such as top surface 240 of silicon layer 208 in optical regions 230 and 232. In the selective epitaxial process, epitaxial layer 238 can be doped with an appropriate dopant having a desired dopant concentration.

By way of background, the particular process chemistry used for epitaxial deposition of silicon determines the thickness of silicon deposited on different materials as a function of time. Although the silicon deposition rate may be similar for different materials once a seed layer is formed, each material typically requires a different amount of time, i.e. an incubation time, to form the seed layer and begin nucleating. For example, for silicon deposition the incubation time required to form a seed layer on silicon oxide is greater than the incubation time required to form a seed layer on silicon. As a result, during epitaxial silicon deposition, a certain thickness of silicon may form on a silicon surface prior to silicon nucleating on a silicon oxide surface.

The difference between the time required to form a seed layer, or nucleate, on silicon oxide, for example, and the time required to form a seed layer on silicon, i.e. the "incubation window," is determined, among other things, by pressure, gas flow, and the chemistries used in the selective epitaxial emitter process. Thus, in the present embodiment, the selective epitaxial process can be engineered to widen the incubation window to achieve a desired thickness for epitaxial layer 238 on exposed portion 218 (FIG. 2B) of bulk silicon substrate 204 without nucleating any silicon on silicon oxide, i.e. on spacers 234 and 236, or on a mask (not shown in FIG. 2C) formed over silicon layer 208 in optical regions 230 and 232. In the present embodiment, epitaxial layer 238 can be grown to a sufficient thickness such that top surface 242 of epitaxial layer 238 is substantially level with top surface 240 of silicon layer 208, i.e. top surface 242 of epitaxial layer 238 and top surface 240 of silicon layer 208 form a substantially planar surface. In other embodiments, top surface 242 of epitaxial layer 238 may be situated above or below top surface 240 of silicon layer 208. In other embodiments, epitaxial layer 238 may comprise semiconductor materials other than single-crystal silicon.

Bulk silicon electronic region 244 of SOI substrate 202 is situated between spacers 234 and 236 and is formed by growing epitaxial layer 238 on bulk silicon substrate 204 as discussed above. Thus, in one embodiment, bulk silicon electronic region 244 comprises single crystal silicon only and has total thickness 246 which is equivalent to thickness 214 (FIG. 2A) of bulk silicon substrate 204 plus depth 228 (FIG. 2B) of trench 216. Thus, in one embodiment, total thickness 246 is equivalent to approximately 1.0 millimeter plus the relatively negligible thickness of approximately 1.5 to 2.0 microns. Thus, electronic region 244 has sufficient thickness to form bulk silicon electronic devices, such as bipolar transistors and/or CMOS devices.

By forming bulk silicon electronic region 244 adjacent to optical regions 230 and 232 in SOI substrate 202, the present invention advantageously achieves integration of optical components in optical regions 230 and 232 with bulk silicon electronic devices in bulk silicon electronic region 244 on a single SOI substrate. Furthermore, optical regions 230 and 232 can be optimized for formation of optical components and devices while bulk silicon devices, such as bipolar transistors and/or CMOS devices, can be formed in sufficiently thick silicon in bulk silicon electronic region 244. The result of step 174 of flowchart 100 is illustrated by structure 274 in FIG. 2C.

Figure 2D:
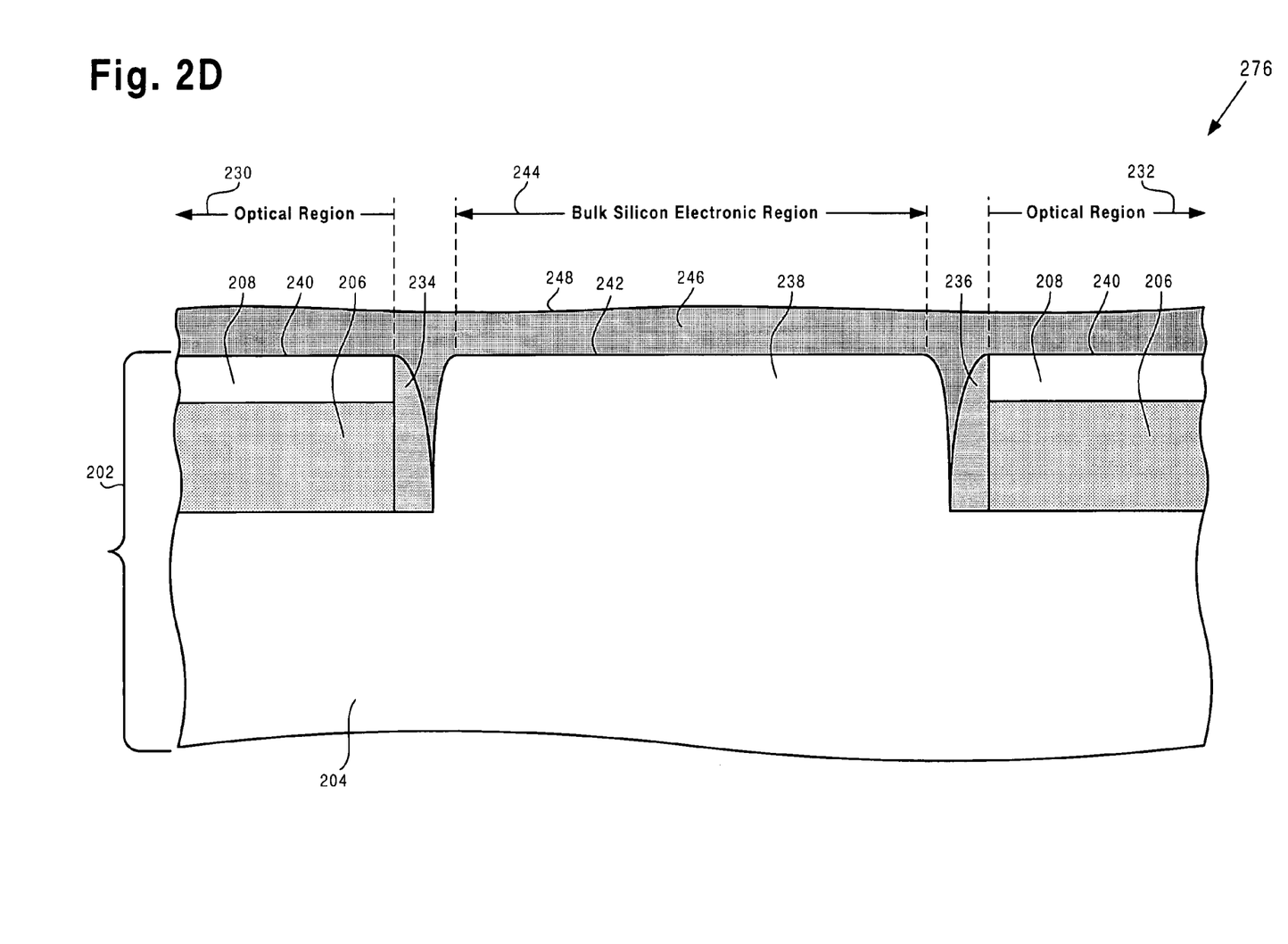
FIG. 2D illustrates a cross-sectional view, which includes a portion of a wafer processed according to an embodiment of the invention, corresponding to an intermediate step of the flowchart in FIG. 1.

Referring to step 176 in FIG. 1 and structure 276 in FIG. 2D, at step 176 of flowchart 100, conformal dielectric layer 246 is formed over SOI substrate 202. Conformal dielectric layer 246, which has top surface 248, is situated on silicon layer 208, spacers 234 and 236, and epitaxial layer 238 and can comprise silicon oxide or other appropriate dielectric. Conformal dielectric layer 246 can be formed by using a CVD process or other appropriate deposition process to deposit a conformal layer of silicon oxide or other appropriate dielectric over SOI substrate 202. The result of step 176 of flowchart 100 is illustrated by structure 276 in FIG. 2D.

Figure 2E:
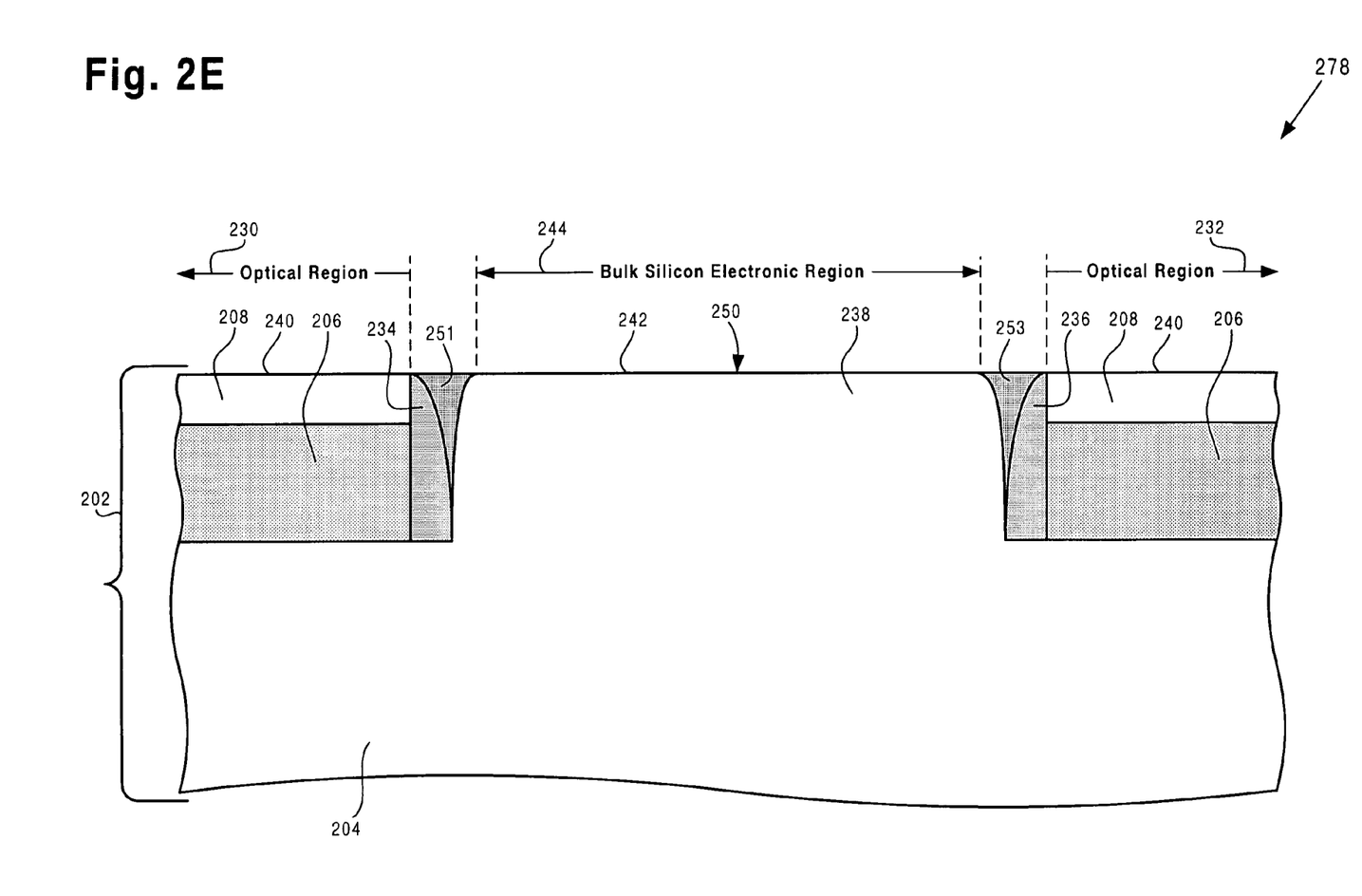
FIG. 2E illustrates a cross-sectional view, which includes a portion of a wafer processed according to an embodiment of the invention, corresponding to an intermediate step of the flowchart in FIG. 1.

Referring to step 178 in FIG. 1 and structure 278 in FIG. 2E, at step 178 of flowchart 100, top surface 248 of conformal dielectric layer 246 on SOI substrate 202 is planarized to form planar surface 250 and expose top surface 240 of silicon layer 208 and top surface 242 of epitaxial layer 238. Planar surface 250 can be formed by using a chemical mechanical polishing ("CMP") process or other appropriate planarization process to remove a sufficient portion of conformal dielectric layer 246 (FIG. 2D) such that top surface 240 of silicon layer 208 and top surface 242 of epitaxial layer 238 are exposed. By way of background, CMP is a wafer flattening and polishing process that combines chemical removal with mechanical buffing, and is used, among other things, for wafer planarization during the wafer fabrication process.

After the planarization process has been performed, conformal dielectric layer portions 251 and 253 remain situated between epitaxial layer 238 and respective spacers 234 and 236. After planar surface 250 has been formed on SOI substrate 202, optical components can be formed in optical regions 230 and 232 of SOI substrate 202 and bulk silicon electronic devices, such as devices formed using SiGe BiCMOS technology, can be formed in bulk silicon electronic region 244 of SOI substrate 202. Conformal dielectric layer portion 251 and spacer 234 provide isolation between optical region 230 and bulk silicon electronic region 244, while conformal dielectric layer portion 253 and spacer 236 provide isolation between optical region 232 and bulk silicon electronic region 244. The result of step 178 of flowchart 100 is illustrated by structure 278 in FIG. 2E.

Figure 2F:
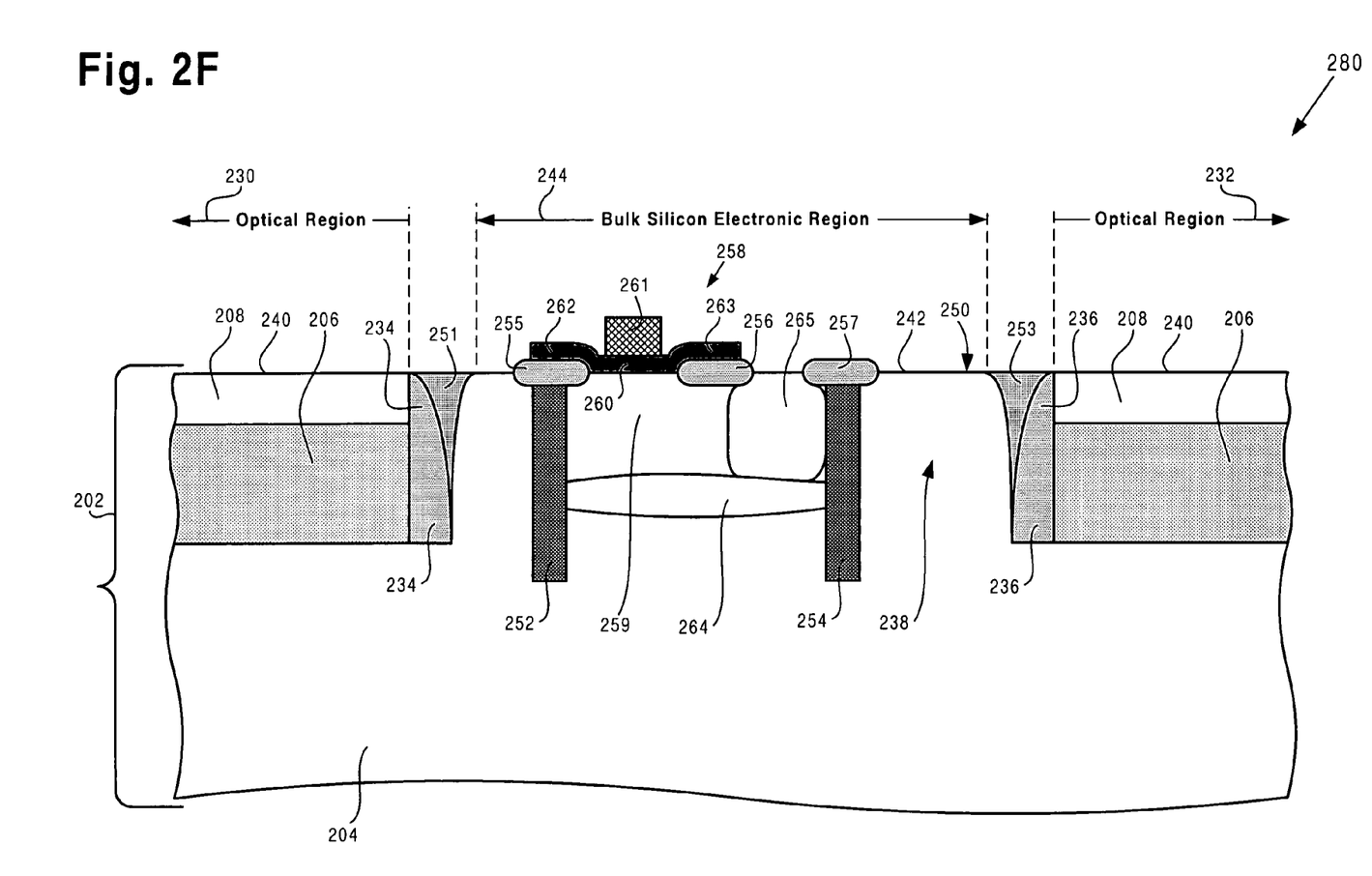
FIG. 2F illustrates a cross-sectional view, which includes a portion of a wafer processed according to an embodiment of the invention, corresponding to an intermediate step of the flowchart in FIG. 1.

Referring to step 180 in FIG. 1 and structure 280 in FIG. 2F, at step 180 of flowchart 100, deep trench structures 252 and 254, field oxide regions 255, 256, and 257, and bipolar transistor 258 are formed in bulk silicon electronic region 244 of SOI substrate 202. Deep trench structures 252 and 254 are situated in epitaxial layer 238 and bulk silicon substrate 204 in bulk silicon electronic region 244 and field oxide regions 255, 256, and 257 are situated on planar surface 250 of SOI substrate 202 and extend into epitaxial layer 238 in bulk silicon electronic region 244. Deep trench structures 252 and 254 and field oxide regions 255, 256, and 257 might comprise, among other things, silicon oxide material and are formed in a manner known in the art. Deep trench structures 252 and 254 and field oxide regions 255, 256, and 257 provide electrical isolation from other devices, such as other bipolar devices and CMOS devices, that may be formed in bulk silicon electronic region 244 of SOI substrate 202.

Bipolar transistor 258 is situated in bulk silicon electronic region 244 and includes collector 259, base 260, and emitter 261. Bipolar transistor 258 can be a SiGe NPN heterojunction bipolar transistor ("HBT") and can be formed by using a SiGe BiCMOS process. In other embodiments, bipolar transistor 258 may be a SiGe PNP HBT or any other type of bipolar transistor. In the example of FIG. 2F, collector 259 of bipolar transistor 258 is situated in epitaxial layer 238 and can be N type single-crystal silicon. Collector 259 can be formed by doping epitaxial layer 238 with an appropriate N type dopant, such as arsenic, using a dopant diffusion process in a manner known in the art.

Base 260 is situated on top surface 242 of epitaxial layer 238 over collector 259 and can comprise P type single-crystal SiGe. Base 260 can be formed by epitaxially depositing a layer of SiGe on top surface 242 of epitaxial layer 238 and on field oxide regions 255 and 256 in a CVD process or other appropriate processes. During the SiGe epitaxially deposition process, single-crystal SiGe is grown on top surface 242 of epitaxial layer 238 between field oxide regions 255 and 256 to form base 260, while polycrystalline SiGe is formed on field oxide regions 255 and 256 to form respective base contact regions 262 and 263. Base 260 may be doped with boron or other appropriate dopant to achieve the aforementioned P type doping.

Emitter 261 is situated on base 260 and can comprise N type polycrystalline silicon. Emitter 261 can be formed by depositing a layer of polycrystalline silicon over base 260 using a CVD process or other appropriate processes. The layer of polycrystalline silicon can then be appropriately patterned and doped with an appropriate N type dopant, such as arsenic, to form emitter 261. Buried conductive layer 264 is situated between deep trench structures 252 and 254 in bulk silicon electronic region 244 and can comprise silicon that is heavily doped with an appropriately N type dopant in a manner known in the art. Collector sinker 265, also comprised of heavily doped N type silicon, is formed by diffusion of heavily concentrated N type dopants from top surface 242 of epitaxial layer 238 down to buried conductive layer 264. Buried conductive layer 264, along with collector sinker 265, provide a low resistance electrical pathway from collector 259 through buried conductive layer 264 to a collector contact (the collector contact is not shown in FIG. 2F).

Thus, by forming bipolar transistor 258 in bulk silicon electronics region 244, the present invention advantageously achieves a SOI substrate having a SiGe bipolar transistor formed in a bulk silicon electronics region that is situated adjacent to optical regions, i.e. optical regions 230 and 232, of the SOI substrate. It is noted that although only one SiGe bipolar transistor, i.e. bipolar transistor 258, is shown in bulk silicon electronic region 244 to illustrate the present invention, bulk silicon electronic region 244 typically includes a large number of devices, such as bipolar and CMOS devices, which can be formed using SiGe BiCMOS technology. The result of step 180 of flowchart 100 is illustrated by structure 280 in FIG. 2F.

Figure 2G:
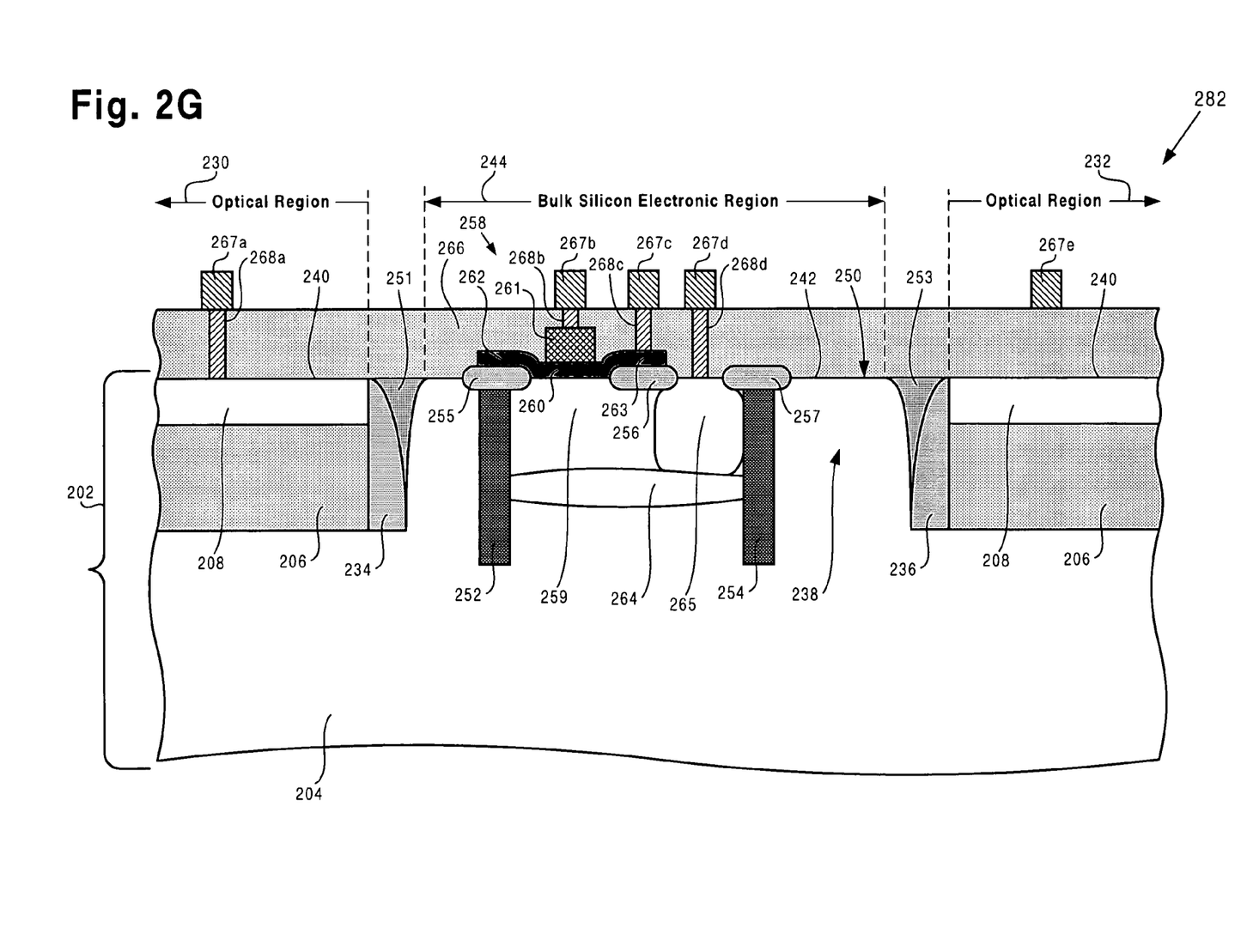
FIG. 2G illustrates a cross-sectional view, which includes a portion of a wafer processed according to an embodiment of the invention, corresponding to a final step of the flowchart in FIG. 1.

Referring to step 182 in FIG. 1 and structure 282 in FIG. 2G, at step 182 of flowchart 100, interlayer dielectric ("ILD") layer 266 is formed on SOI substrate 202, contacts 268a, 268b, 268c, and 268d are formed in ILD layer 266, and metal segments 267a, 267b, 267c, 267d, and 267e are patterned on ILD layer 266. ILD layer 266 is situated on surface 250 of SOI substrate 202 and can comprise silicon oxide or other appropriate dielectric, such as a dielectric having a low dielectric constant, i.e. a low-k dielectric. ILD layer 266 can be formed by a CVD process or other appropriate deposition processes. Contact 268a is situated in ILD layer 266 over optical region 230 and contacts 268b, 268c, and 268d are situated in ILD layer 266 over bulk silicon electronic region 244. In particular, contact 268b is situated over emitter 261, contact 268c is situated over base contact region 263, and contact 268d is situated over collector sinker 265. Contacts 268a, 268b, 268c, and 268d can comprise tungsten or other appropriate metal and can be formed by etching a contact hole in ILD layer 266 using a plasma etch or other appropriate etch process. The contact hole can then be filled with tungsten or other appropriate metal to form contacts 268a, 268b, 268c, and 268d.

Interconnect metal segment 267a is situated on ILD layer 266 over contact 268a, interconnect metal segments 267b, 267c, and 267d are situated on ILD layer 266 over respective contacts 268b, 268c, and 268d, and interconnect metal segment 267e is situated on ILD layer 266 over optical region 232 of SOI substrate 202. Interconnect metal segments 267a, 267b, 267c, and 267d can comprise aluminum, copper, or other suitable metal and may be formed by depositing and patterning a layer of interconnect metal on ILD layer 266 in a manner known in the art. Interconnect metal segment 267a is connected to optical region 230 by contact 268a and interconnect metal segments 267b, 267c, and 267d are connected to emitter 261, base 260, and collector 259 of bipolar transistor 258 in bulk silicon electronic region 244 by respective contacts 268b, 268c, and 268d.

Interconnect metal segment 267a can be connected to interconnect metal segment 267b, 267c, or 267d in the same interconnect metal layer that they, i.e. interconnect metal segments 268a, 267b, 267c, and 267d, are formed in or connected in a higher interconnect metal layer (not shown in FIG. 2G) to provide communication between optical region 230 and bipolar transistor 258 in bulk silicon electronic region 244. The result of step 182 of flowchart 100 is illustrated by structure 282 in FIG. 2G.

Thus, as discussed above, the present invention achieves a SOI substrate having a bulk silicon electronic region, which includes an epitaxial layer situated on a bulk silicon substrate, situated adjacent to an optical region, which includes a silicon layer situated on a buried oxide layer, where the bulk silicon electronic region includes a SiGe bipolar transistor. As a result, the present invention advantageously achieves a SOI substrate suitable for integrating optical components, such as waveguides, gratings, and modulators, in an optical region of the SOI substrate with devices formed using SiGe BiCMOS technology, such as a SiGe bipolar transistor, in a bulk silicon electronic region of the SOI substrate.

Also, the present invention advantageously provides a SOI substrate having an optical region that can be optimized for formation of optical components while providing an adjacent bulk silicon electronic region for formation of a SiGe bipolar transistor or other devices formed using SiGe BiCMOS technology. Thus, by providing a bulk silicon electronic region and an optical region in a single SOI substrate, the present invention advantageously eliminates the complexity associated with attempting to form bulk silicon electronic devices, such as a SiGe bipolar transistor, in silicon and buried oxide layers of a SOI substrate that are optimized for formation of optical components.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, SOI substrate for integration of opto-electronics with SiGe BiCMOS has been described.

The invention claimed is:

1. A structure comprising:
a silicon-on-insulator substrate comprising a buried oxide layer having a first thickness situated over a bulk silicon substrate and a silicon layer having a second thickness situated directly on said buried oxide layer;
a trench situated in said silicon layer and said buried oxide layer, said trench having a bottom surface and a first and a second sidewall, said trench being situated adjacent to an optical region of said silicon-on-insulator substrate, wherein said optical region comprises at least one optical component;
an epitaxial layer situated in said trench and situated on said bulk silicon substrate, said epitaxial layer and said bulk silicon substrate forming a bulk silicon electronic region of said silicon-on-insulator substrate;
a base of a bipolar transistor situated on said epitaxial layer, said base comprising silicon-geranium;
wherein said optical region of said silicon-on-insulator substrate is optimized for said at least one optical component by controlling said first thickness of said buried oxide layer and said second thickness of said silicon layer.

2. The structure of claim 1 further comprising a first spacer and a second spacer, said first spacer being situated between said first sidewall of said trench and said epitaxial layer said second spacer being situated between said second sidewall of said trench and said epitaxial layer.

3. The structure of claim 1 further comprising an interlayer dielectric layer situated over said silicon-on-insulator substrate.

4. The structure of claim 3 further comprising a first interconnect metal segment and a second interconnect metal segment situated on said interlayer dielectric layer, said first interconnect metal segment connected to said optical region by a first contact and said second interconnect metal segment connected to said base of said bipolar transistor by a second contact.

5. The structure of claim 1 further comprising an emitter of said bipolar transistor situated on said base.

6. The structure of claim 1 wherein said base is situated over a collector of said bipolar transistor, said collector being situated in said epitaxial layer.

7. The structure of claim 1 wherein said base comprises single-crystal silicon-germanium.

8. The structure of claim 1 wherein said silicon-on-insulator substrate has a planar surface, said planar surface including a top surface of said silicon layer and a top surface of said epitaxial layer.

9. The structure of claim 1 wherein said trench has a depth of between approximately 1.5 microns and approximately 2.0 microns.

10. The structure of claim 1 wherein said second thickness of said silicon layer is between approximately 3000.0 Angstroms and approximately 6000.0 Angstroms.

11. A method comprising:
providing a silicon-on-insulator substrate comprising a buried oxide layer having a first thickness situated over a bulk silicon substrate and a silicon layer having a second thickness situated directly on said buried oxide layer;
forming a trench in said silicon layer and said buried oxide layer, said trench exposing a portion of said bulk silicon substrate, said trench being situated adjacent to an optical region of said silicon-on-insulator substrate, wherein said optical region comprises at least one optical component;
forming an epitaxial layer on said exposed portion of said bulk silicon substrate in said trench, said epitaxial layer and said bulk silicon substrate forming a bulk silicon electronic region of said silicon-on-insulator substrate;
forming a base of a bipolar transistor on said epitaxial layer in said bulk silicon electronic region;
wherein said base of said bipolar transistor comprises silicon-germanium, wherein said optical region of said silicon-on-insulator substrate is optimized for said at least one optical component by controlling said first thickness of said buried oxide layer and said second thickness of said silicon layer.

12. The method of claim 11 further comprising a step of forming a spacer adjacent to a sidewall of said trench after said step of forming said trench and prior to said step of forming said epitaxial layer.

13. The method of claim 11 further comprising steps of:
forming an interlayer dielectric layer over said silicon-on-insulator substrate;
forming a first and a second contact in said interlayer dielectric layer, said first contact being situated over said optical region and said second contact being situated over said bipolar transistor.

14. The method of claim 13 further comprising steps of:
forming a first and a second interconnect metal segment on said interlayer dielectric layer, said first interconnect metal segment being situated over said first contact and said second interconnect metal segment being situated over said second contact.

15. The method of claim 11 wherein said step of forming said base of said bipolar transistor comprises steps of:
forming a first and a second field oxide region in said bulk silicon electronic region;
growing said base of said bipolar transistor on said epitaxial layer between said first field oxide region and said second field oxide region.

16. The method of claim 11 wherein a top surface of said epitaxial layer and a top surface of said silicon layer form a substantially planar surface.

17. The method of claim 11 further comprising a step of forming an emitter on said base of said bipolar transistor.

18. The method of claim 11 wherein said step of forming said epitaxial layer comprises using a selective epitaxial process to grow said epitaxial layer on said exposed portion of said bulk silicon substrate.

19. The method of claim 11 wherein said trench has a depth of between approximately 1.5 microns and approximately 2.0 microns.

20. The method of claim 11 wherein said second thickness of said silicon layer is between approximately 3000.0 Angstroms and approximately 6000.0 Angstroms.

* * * * *

UNITED STATES PATENT AND TRADEMARK OFFICE
CERTIFICATE OF CORRECTION

PATENT NO. : 7,339,254 B1  
APPLICATION NO. : 11/018164  
DATED : March 4, 2008  
INVENTOR(S) : Paul Kempf Page 1 of 1

It is certified that error appears in the above-identified patent and that said Letters Patent is hereby corrected as shown below:

In the claims, column 9, line 42, "silicon-geranium" should be changed to --silicon-germanium--.

Signed and Sealed this

Eighth Day of July, 2008

JON W. DUDAS  
*Director of the United States Patent and Trademark Office*